(12) United States Patent
Hetzler et al.

(10) Patent No.: US 10,337,850 B2
(45) Date of Patent: Jul. 2, 2019

(54) INTERFEROMETRIC MEASURING ARRANGEMENT

(71) Applicant: Carl Zeiss SMT GmbH, Oberkochen (DE)

(72) Inventors: Jochen Hetzler, Aalen (DE); Sebastian Fuchs, Aalen (DE); Hans-Michael Stiepan, Aalen (DE); Karl-Heinz Schuster, Koenigsbronn (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/821,050

(22) Filed: Nov. 22, 2017

(65) Prior Publication Data

US 2018/0106591 A1 Apr. 19, 2018

Related U.S. Application Data

(63) Continuation of application No. PCT/EP2016/000820, filed on May 18, 2016.

(30) Foreign Application Priority Data

May 22, 2015 (DE) .................... 10 2015 209 490

(51) Int. Cl.
*G01B 9/02* (2006.01)
*G01M 11/00* (2006.01)
*G01B 11/24* (2006.01)
*G02B 5/08* (2006.01)
*G03F 7/20* (2006.01)
(Continued)

(52) U.S. Cl.
CPC .......... *G01B 9/02039* (2013.01); *B21D 11/10* (2013.01); *C03B 37/15* (2013.01);
(Continued)

(58) Field of Classification Search
CPC ............ G01B 9/02039; G01B 9/02034; G01B 9/02057; G01B 11/24; G01B 11/2441
See application file for complete search history.

(56) References Cited

U.S. PATENT DOCUMENTS 5,361,312 A 11/1994 Kuchel
5,745,289 A 4/1998 Hamblen
(Continued)

FOREIGN PATENT DOCUMENTS

DE 19643074 A1 11/1997
DE 19820785 A1 10/1999
(Continued)

OTHER PUBLICATIONS

International Search Report and Written Opinion in counterpart International Application No. PCT/EP2016/000820, dated Nov. 30, 2016.

(Continued)

*Primary Examiner* — Jonathan M Hansen
(74) *Attorney, Agent, or Firm* — Edell, Shapiro & Finnan, LLC

(57) ABSTRACT

A measurement arrangement (10) and an associated method for interferometrically determining the surface shape (12) of a test object (14) includes a light source (16) providing an input wave (18) and a diffractive optical element (24). The diffractive optical element is configured to produce in each case by way of diffraction from the input wave a test wave (26), which is directed at the test object (14) and has a wavefront that is adapted at least partially to a desired shape of the optical surface, and a reference wave (28). The measurement arrangement furthermore includes a reflective optical element (30) that back-reflects the reference wave (28) and a capture device (36) that captures an interferogram produced by superposing the test wave after interaction with the test object and the back-reflected reference wave (28), in each case after a further diffraction at the diffractive optical element in a capture plane (48).

13 Claims, 7 Drawing Sheets

(51) Int. Cl.
    *B21D 11/10*     (2006.01)
    *C03B 37/15*     (2006.01)
    *G02B 13/14*     (2006.01)
    *G01M 11/02*     (2006.01)

(52) U.S. Cl.
    CPC ..... *G01B 9/02028* (2013.01); *G01B 9/02032* (2013.01); *G01B 9/02057* (2013.01); *G01B 9/02072* (2013.04); *G01B 11/2441* (2013.01); *G01M 11/005* (2013.01); *G01M 11/0264* (2013.01); *G02B 5/08* (2013.01); *G02B 13/143* (2013.01); *G03F 7/702* (2013.01); *G03F 7/706* (2013.01); *G01B 2290/30* (2013.01)

(56) References Cited

U.S. PATENT DOCUMENTS

| | | | | |
|---|---|---|---|---|
| 6,344,898 | B1* | 2/2002 | Gemma | G01B 11/255 356/513 |
| 8,345,262 | B2 | 1/2013 | Schillke et al. | |
| 2003/0128370 | A1* | 7/2003 | De Lega | G02B 5/1871 356/521 |
| 2005/0225774 | A1 | 10/2005 | Freimann | |
| 2009/0207416 | A1* | 8/2009 | Xiangqian | G01B 11/2441 356/477 |
| 2010/0317264 | A1 | 12/2010 | Kino et al. | |
| 2015/0198438 | A1 | 7/2015 | Hetzler | |

FOREIGN PATENT DOCUMENTS

| | | |
|---|---|---|
| DE | 102005013903 A1 | 12/2005 |
| DE | 102012217800 A1 | 4/2014 |
| WO | 2014048574 A3 | 4/2014 |

OTHER PUBLICATIONS

Kino et al., "Interferometric testing for off-axis aspherical mirrors with computer-generated holograms", Applied Optics, Optical Society of America, vol. 51, No. 19, Jul. 2012, pp. 4291-4297.

Malacara, Daniel, "Optical Shop Testing", Third Edition, John Wiley & Sons, Inc., 2007, Chapter 2.8.2, pp. 80-83.

Malacara, Daniel, "Optical Shop Testing", Third Edition, John Wiley & Sons, Inc., 2007, pp. 142-143.

Feenix, Y. Pan et al., "Efficient testing of segmented aspherical mirrors by use of a reference plate and computer-generated hologrmas. II. Case study, errors analysis, and experimental validation", 2004, Applied Optics, vol. 43, Issue 28, pp. 5313-5322.

Asfour, Jean-Michel et al., "Asphere testing with a Fizeau interferometer based on a combined computer-generated hologram", J. Opt. Soc. Am. A, vol. 23, No. 1, Jan. 2006.

Soons, Johannes A. et al., "Absolute interferometric tests of spherical surfaces based on rotational and translational shears", Proc. SPIE 8493, Interferometry XVI, Techniques and Analysis, 84930G, Sep. 2012.

Su, Dongqui et al., "Absolute surface figure testing by shift-rotation method using Zernike polynomials", Optics Letter, vol. 37, No. 15, Aug. 2012.

Schreiner R. et al., "Absolute testing of the reference surface of a Fizeau interferometer through even/odd decompositions", Applied Optics, vol. 47, 2008, No. 32, pp. 6134-6141.

Office Action in corresponding German Application 102015209490.1, dated Jan. 21, 2016, along with English Translation.

Chen, C.W et al., "Holographic Twyman-Green interferometer", Applied Optics, 1982, vol. 21, No. 14, pp. 2563-2568.

European Communication, 16729770.4, dated Nov. 14, 2018, 11 pages.

\* cited by examiner

INTERFEROMETRIC MEASURING ARRANGEMENT

CROSS REFERENCE TO RELATED APPLICATIONS

This is a Continuation of International Application PCT/EP2016/000820 which has an international filing date of May 18, 2016, and the disclosure of which is incorporated in its entirety into the present Continuation by reference. The following disclosure is also based on and claims the benefit of and priority under 35 U.S.C. § 119(a) to: German Patent Application No. DE 10 2015 209 490.1, filed May 22, 2015, which is also incorporated in its entirety into the present Continuation by reference.

FIELD OF THE INVENTION

The invention relates to a measurement arrangement and to a method for interferometrically determining a shape of a surface of a test object. The invention furthermore relates to a production method for a mirror, a mirror having a surface for reflecting extreme ultraviolet radiation, and a microlithographic projection lens having such a mirror.

BACKGROUND

For the highly accurate interferometric measurement of a surface shape of a test object, such as a microlithographic optical element, diffractive optical arrangements are often used as what are known as null optics. In this case, the wavefront of a test wave is adapted to a desired shape of the surface by way of a diffractive element such that it would be perpendicularly incident on the desired shape at every location and be reflected back on itself thereby. Deviations from the desired shape can be determined by superposing a reference wave on the reflected test wave. The diffractive element used can be, for example, a computer-generated hologram (CGH).

DE 10 2012 217 800 A1 describes such a measurement arrangement having a complex coded CGH. A light wave is initially split into a reference wave and a test wave using a Fizeau element. The test wave is then converted by the complex coded CGH into a test wave having a wavefront that is adapted to the desired shape of the surface and calibration waves having a spherical or plane wavefront. To this end, the CGH has suitably configured diffractive structures. The calibration waves are used to calibrate the CGH. A test object is subsequently arranged in the test position, and a measurement using the test wave is performed. The test wave is reflected by the surface of the test object, transformed back by the CGH, and, after it passes through the Fizeau element, it is superimposed by the reference wave. It is possible to determine the shape of the surface from the interferogram captured in a plane. Here, a very high degree of accuracy is attained due to the calibration of the CGH.

However, one problem in measuring highly accurate surfaces using the known interferometric apparatuses is that a change in the optical properties of the CGH or other optical elements of the interferometer can occur between the calibration and the subsequent measurement of the test object. Such changes are caused in particular by temperature changes. In the case of a CGH with a quartz substrate, even inhomogeneous temperature changes in the mK range can cause a reduction in the measurement accuracy after a calibration.

This problem occurs in particular in the case of large and heavy test objects, such as for example microlithographic EUV mirrors. These test objects can be only slowly moved into a test position. In the process, a significant amount of energy and thus also heat is introduced into the measurement arrangement. Surfaces of optical elements having a significantly higher temperature with respect to the environment can also be determined only with insufficient measurement accuracy. Such optical elements could be employed in EUV microlithography due to desired power increases of the exposure radiation and an associated increased heating of the optical elements.

SUMMARY

It is an object of the invention to provide an apparatus and a method which solve the aforementioned problems and, in particular, make possible a highly accurate determination of the surface shape of large test objects or test objects that are warmer than the environment.

This object is achieved in accordance with one formulation of the invention by way of the measurement arrangement below for interferometrically determining a shape of a surface of a test object. The measurement arrangement comprises a light source for providing an input wave and a diffractive optical element which is arranged in the beam path of the input wave and is suitably configured to produce in each case by way of diffraction from the input wave a test wave, which is directed at the test object and has a wavefront that is adapted at least partially to a desired shape of the optical surface, and a reference wave having a propagation direction that deviates from a propagation direction of the test wave. The measurement apparatus furthermore comprises a reflective optical element, which is arranged in the beam path of the reference wave and is configured for back-reflection of the reference wave, and a capture device for capturing an interferogram which is produced by superposition of the test wave after interaction with the test object and the back-reflected reference wave, in each case after a further diffraction at the diffractive element, in a capture plane.

This object is furthermore achieved by way of the method described below for interferometrically determining a shape of a surface of a test object. The method comprises the following steps: providing an input wave, producing a test wave, which is directed at the test object and has a wavefront that is adapted at least partially to a desired shape of the optical surface, and a reference wave, which is directed at a reflective optical element and has a propagation direction that deviates from a propagation direction of the test wave, from the input wave in each case by diffraction at a diffractive optical element, superposing the test wave after interaction with the test object with the reference wave after back-reflection at the reflective optical element, wherein the test wave and the reference wave are diffracted again in each case at the diffractive optical element for superposition, and capturing an interferogram produced by the superposition of the test wave and the reference wave in a capture plane.

The term "diffraction" within the context of this text is understood to mean a first-order or higher-order of diffraction. A zero order of diffraction of a wave that is radiated onto a diffractive element in this text is not considered a wave produced "by diffraction." The diffractive optical element contained in the above-mentioned measurement arrangement according to the invention or in the above-mentioned method according to the invention is thus configured to produce from the input wave first the test wave by way of, in terms of absolute value, first-order or higher-order diffraction, and also the reference wave by way of, in terms of absolute value, first-order or higher-order diffraction.

In other words, the measurement arrangement according to the invention constitutes an interferometer in which a diffractive optical element is used as a beam splitter to produce a test wave and a reference wave. The diffractive element is additionally used as null optics for adapting the wavefront of the test wave to a desired shape of the surface of the test object. A separate beam splitter, such as for example a Fizeau element, for splitting the input wave into a test wave and a reference wave is not necessary. After interaction with the test object or the reflective optical element, the same diffractive optical element is used for the superposition of the reference wave on the test wave. Deviations of the diffractive element from a desired shape, such as for example due to heating during operation, thus affect the test wave and also the reference wave. When the reference wave is superposed on the test wave, these errors are compensated as far as possible. A corresponding approach is used for the method according to the invention. The measurement arrangement according to the invention and the corresponding method are consequently suitable in particular for measuring large aspherical surfaces of test objects that are warmer than the environment.

The interaction of the test wave with the test object can be a reflection, e.g. when the test object is a mirror, or a transmission, e.g. when the test object is a lens. In the latter case, the test wave is preferably reflected back at a mirror after it has passed through the lens.

In accordance with an embodiment, the diffractive optical element is configured to produce the test wave and the reference wave in transmission by way of diffraction. Alternatively, both waves can be produced in reflection by way of diffraction using the diffractive optical element. Preferably, the test object is arranged in the beam path of the test wave after it is produced at the diffractive optical element as the next optical element. Accordingly, the reflective optical element can be arranged in the beam path of the reference wave after the diffractive optical element as the next optical element. With these measures, two interferometer arms are defined in which no further optical material is located that could induce measurement errors for example due to heating.

Upon the further diffraction, the test wave is diffracted, in accordance with a further embodiment, at the diffractive optical element with the same order of diffraction as the input wave upon the diffraction at the diffractive optical element that takes place to produce the test wave. If, for example, the test wave is produced by way of diffraction of the input wave at the diffractive optical element in the first order of diffraction, then the further diffraction of the test wave at the diffractive optical element, which takes place after the interaction with the test object, is also effected in the first order of diffraction.

Upon the further diffraction, the reference wave is diffracted, in accordance with a further embodiment, at the diffractive optical element with the same order of diffraction as the input wave upon the diffraction at the diffractive optical element that takes place to produce the reference wave.

In accordance with a further embodiment, the propagation direction of the reference wave, which is produced by diffraction at the diffractive optical element from the input wave, is tilted with respect to the propagation direction of the input wave by more than 1°, in particular by more than 5°.

Upon the further diffraction at the diffractive optical element, a return wave is produced, in accordance with a further embodiment, by superposition of the test wave after interaction with the test object and the back-reflected reference wave, wherein the propagation direction of the return wave is tilted with respect to the reverse propagation direction of the input wave by less than 1°.

In accordance with a further embodiment, the wavefront of the test wave after the further diffraction at the diffractive optical element deviates from a spherical wavefront that is best adapted to the wavefront of the input wave by at most 10 µm, in particular by at most 1 µm. To determine the spherical wavefront that is best adapted, it is possible for example for the mean square deviation (rms) to be minimized as a criterion. A deviation of at most 10 µm from the spherical wavefront that is best adapted is understood to mean that the deviation that is present at the location of the greatest deviation of the wavefront of the test wave after the further diffraction from the wavefront of the spherical wave that is best adapted is at most 10 µm.

In accordance with an embodiment of the measurement arrangement according to the invention, the diffractive optical element includes a diffractive structure that is configured to produce the test wave in a first order of diffraction and to produce the reference wave in a further order of diffraction. To this end, for example a computer-generated amplitude or phase hologram can be used. By using the same diffractive structure to produce the test wave and the reference wave, changes in the optical properties of the diffractive structures that occur during operation, such as by inhomogeneous heating of the diffractive element, have the same effect on both waves. Upon superposition of the reference wave on the test wave, these errors are compensated for the most part, as a result of which a highly accurate measurement of the surface shape of the test object is made possible.

In accordance with a further embodiment according to the invention, the diffractive optical element has two diffractive structural patterns that are arranged such that they superimpose each other in a plane, wherein one of the diffractive structural patterns is configured for producing the test wave and the other diffractive structural pattern is configured for producing the reference wave. The diffractive optical element herefor can comprise for example a complex coded CGH. The complex coded CGH has in a plane diffractive structures that are the result of a superposition of the diffractive structural pattern for the test wave and of the diffractive structural pattern for the reference wave. The complex coded CGH preferably produces both waves in transmission or both waves in reflection. As a result, the diffractive structures of the CGH can be produced in one production process and are therefore subject to the same production tolerances or production errors. These can be ascertained during calibration of the CGH. In particular, operation-related deviations of the diffractive structures, e.g. caused by heating, from a desired shape are compensated upon superposition of the reference wave on the test wave.

The input wave of the measurement arrangement according to the invention either has a plane, a spherical or a free-form wavefront. A free-form wavefront here refers to a wavefront of an electromagnetic wave that exhibits a deviation of at least 10λ from any ideal sphere, in particular from the sphere that is best adapted to the wavefront, wherein λ is the wavelength of the wave. In other words, the wavefront of the free-form wavefront deviates at least in one point from every ideal sphere by at least 10λ.

In accordance with an embodiment according to the invention, a collimator is provided in the beam path of the input wave for producing a collimated input wave having a plane wavefront from the input wave. Other embodiments have a suitably configured optical arrangement for producing an input wave having a spherical wavefront or having a free-form wavefront in the beam path of the input wave. Depending on the surface of the test object and the diffractive element used, one of the above-mentioned wavefront shapes is preferred for a surface measurement.

In accordance with an embodiment according to the invention, the reflective optical element comprises a plane mirror for back-reflection of a reference wave having a plane wavefront. In alternative embodiments according to the invention, the reflective optical element can have a concave or convex spherical mirror for back-reflection of a reference wave having a spherical wavefront, or have a mirror with a free-form surface as the reflection surface for back-reflection of a reference wave having a free-form wavefront. A free-form surface is here understood to be a non-rotation-symmetric, non-spherical surface, which is describable e.g. by way of polynomials or splines.

In an embodiment according to the invention, the diffractive structural pattern for producing the reference wave is furthermore configured for adapting the wavefront of the reference wave to the shape of the reflective optical element such that the reference wave is reflected back to the diffractive element. In particular, the diffractive structural pattern is configured such that the reference wave is reflected back on itself. As a result, the input wave no longer needs to have a wavefront that is adapted to the reflective optical element. An adaptation of the wavefront of the reference wave now takes place by way of the diffractive optical element.

In accordance with an embodiment according to the invention, the reflective optical element is mounted such that it is tiltable with respect to an axis that is arranged perpendicular to the propagation direction of the reference wave. By appropriate tilting of the reflective optical element, the reference wave is tilted with respect to the test wave. In this way it is possible to realize a multi-fringe interferometry or displaced measurement interferometry (DMI) that is known to a person skilled in the art and described, for example, in U.S. Pat. No. 5,361,312.

In a further embodiment according to the invention, the reflective optical element is mounted such that it is displaceable along a propagation direction of the reference wave. In particular, the reflective optical element is displaceable in increments in fractions of the wavelength of the reference wave or continuously. It is possible hereby to realize a phase displacement interferometry that is known to a person skilled in the art for example from U.S. Pat. No. 5,361,312. In particular, the displaceably mounted reflective optical element is configured as a plane mirror.

According to further embodiments according to the invention, the reflective optical element, the diffractive optical element or both optical elements have a respective substrate which contains an optical material having a coefficient of thermal expansion in the temperature range of 5° C. to 35° C. of, in terms of absolute value, at most $0.5 \times 10^{-6} K^{-1}$ (i.e. the coefficient of thermal expansion is at least $-0.5 \times 10^{-6} K^{-1}$ and at most $+0.5 \times 10^{-6} K^{-1}$). The coefficient of thermal expansion in the temperature range 0° C. to 50° C. in particular is, in terms of absolute value, at most $0.05 \times 10^{-6} K^{-1}$. Examples of optical materials having a very small coefficient of thermal expansion comprise quartz, Zerodur®, a product from Schott AG, and ULE® glass (Ultra Low Expansion Glass), a product from Corning Inc. Alternatively or additionally, the substrate contains an athermal optical material. Referred to as an athermal optical material is a material in which temperature-related changes in the refractive index and expansion of the material at least partially are compensated in terms of their optical effect. The optical path length in these materials is thus largely independent of the temperature. Examples of athermal optical materials comprise calcium fluoride ($CaF_2$) and P-PK53, a product from Schott AG. Furthermore, the substrate can also be formed from layers of different materials. Temperature-dependent changes in the optical properties of the diffractive or reflective optical element are effectively reduced by these measures.

In accordance with an embodiment according to the invention, the measurement arrangement is arranged within a chamber that is filled with air at a pressure of less than 100 mbar or with helium at atmospheric pressure. Such a vacuum or helium has only a minor temperature-dependent change in refractive index. Vacuum furthermore has the advantage that no appreciable heat conduction or convection occurs.

In further embodiments according to the invention, the measurement arrangement furthermore includes at least one heat shield for shielding the diffractive optical element, the reflective optical element or both optical elements against thermal radiation from heat sources. The arrangement of a heat shield can be effected for example in the immediate proximity of the diffractive optical element, the reflective optical element or a heat source. A heat shield according to an embodiment includes on a surface a coating made of a material that absorbs thermal radiation. Provided on an opposite surface can be a coating made of a material that strongly reflects thermal radiation, such as gold. The absorbing coating is preferably arranged on the surface of the heat shield that faces the diffractive or reflective optical element. In this way, heating of the diffractive or the reflective optical element and thus any associated measurement errors are effectively minimized.

In accordance with an embodiment according to the invention, the measurement arrangement includes a heating apparatus for heating the test object to a specified temperature. In particular, the heating apparatus is suitably configured for heating the test object to a temperature of greater than 32° C. or greater than 35° C. or greater than 40° C. The heating apparatus preferably regulates the entire test object at least during a measurement to a specified temperature and in the process also takes into consideration heat induced by measurement radiation or by thermal radiation or thermal conduction of other components of the measurement arrangement. As a result, it is possible to measure a surface of test objects, e.g. EUV mirrors, at their intended operating temperature that is significantly above the temperature of the environment.

In accordance with an embodiment of the measurement arrangement according to the invention, a plane calibration mirror is additionally provided and the diffractive optical element is configured to produce, by way of diffraction, from the input wave furthermore a calibration wave which is directed at the calibration mirror and has a plane wavefront. The diffractive optical element in an embodiment in particular comprises at least one diffractive structure for producing the test wave and the reference wave and a further diffractive structure for producing the calibration wave having a plane wavefront from the input wave. Preferably, three mutually superposing diffractive structures are provided in a plane in the diffractive optical element for producing the test wave, the reference wave and the plane calibration wave. For example a correspondingly configured complex coded CGH can be used herefor. In accordance with an embodiment, the calibration wave is reflected back on itself by the plane calibration mirror. In this way, the calibration wave can be measured by the capture device, after further diffraction by the diffractive element, by superposition with the reference wave. As a result, a highly accurate calibration of the diffractive element, of the capture unit and of further components of the measurement arrangement is made possible.

Accordingly, a spherical calibration mirror is additionally provided in a further embodiment according to the invention, and the diffractive optical element is configured to produce, by way of diffraction, from the input wave a calibration wave which is directed at the spherical calibration mirror and has a spherical wavefront. In particular, the diffractive optical element comprises a further diffractive structure for producing the calibration wave having a spherical wavefront from the input wave. Once again, three mutually superposing diffractive structural patterns can be provided in a plane, e.g. as a complex coded CGH, in the diffractive optical element for producing the test wave, the reference wave and the spherical calibration wave. The spherical calibration wave is preferably reflected back on itself by the spherical calibration mirror and is measured by the capture device after further diffraction at the diffractive optical element and superposition with the reference wave. A highly accurate calibration of the diffractive optical element is also achieved in this way.

In accordance with an embodiment of the invention, additionally provided are a plane calibration mirror and a spherical calibration mirror and the diffractive optical element is configured to produce, by way of diffraction, from the input wave furthermore a calibration wave which is directed at the plane calibration mirror and has a plane wavefront and a calibration wave which is directed at the spherical calibration mirror and has a spherical wavefront. In particular, the diffractive optical element comprises diffractive structures for producing the test wave, the reference wave, a plane calibration wave and a spherical calibration wave. The diffractive optical element preferably comprises a diffractive structure which represents a superposition of four diffractive structural patterns to produce in each case one of the above-mentioned waves. For example, a complex coded CGH can be used herefor, as is disclosed in DE 10 2012 217 800 A1. With two calibration waves, a highly accurate calibration of the diffractive optical element becomes possible.

The measurement arrangement in a further embodiment according to the invention additionally comprises a closure apparatus arranged in the beam path of the first, plane calibration wave and the second, spherical calibration wave, which closure apparatus selectively allows passage of either the plane calibration wave or the spherical calibration wave. In particular, the closure apparatus comprises two closure elements that are matched to each other and are designed e.g. in each case in the form of a shutter. With this measure, it is possible in a quick and uncomplicated manner to select in the course of a calibration in each case a calibration wave for calibration purposes. In further embodiments, it is possible for a closure element, for example a shutter, to be provided for one or both calibration waves, which shutter blocks the respective calibration wave or allows it to pass independently of the other calibration wave.

An embodiment of the method according to the invention for interferometrically determining a shape of a surface of a test object furthermore comprises the following steps: producing at least one calibration wave which is directed at a calibration mirror and has a plane or spherical wavefront from the input wave by way of the diffractive optical element, determining surface defects of the reflective optical element and the at least one calibration mirror, measuring a wavefront difference between the reflective optical element and the calibration mirror, determining calibration corrections from the measured wavefront difference and the surface defects, and determining the shape of the surface of the test object from the captured interferogram taking into consideration the calibration corrections.

To determine surface defects of the reflective optical element or of the calibration mirror, for example a three-position test method that is known to a person skilled in the art can be used. Such a method is known for example from DE 198 20 785 A1. In this method, the respective optical element is interferometrically measured in different rotational positions about the optical axis and different positions along the optical axis of the optical element using the capture unit and the diffractive optical element. Measurements can be made e.g. in a basic position, a position that is rotated by 180°, and a cat's eye position. The surface shape can be determined absolutely from the captured interferograms. A further method that can be used to determine the surface defects is the shift-rotation method. This method is described in "Absolute surface figure testing by shift-rotation method using Zernike polynomials," Su et al., Optics Letters, Vol. 37, Issue 15, pages 3198-3200 (2012).

The wavefront difference is preferably measured by the capture device. In this case, an interferogram which is produced by superposition of the calibration wave on the reference wave in the capture plane is captured and evaluated. It is possible with this method to perform a highly accurate calibration of the diffractive optical element and of the other components of the measurement apparatus.

In accordance with a configuration variant according to the invention, a first calibration wave which is directed at a first calibration mirror and has a plane wavefront and a second calibration wave which is directed at a second calibration mirror and has a spherical wavefront is produced from the input wave by way of the diffractive optical element, in each case a wavefront difference between the reflective optical element and the first calibration mirror and the second calibration mirror, respectively, is measured, and the calibration corrections are determined from the measured wavefront differences and the surface defects. The capture device of the measurement arrangement can also be used in this case to measure the wavefront different. When measuring the wavefront difference between the first calibration wave and the reference wave, blocking of the second calibration wave by way of a closure element and vice versa can furthermore be provided.

According to the invention, furthermore provided is a production method for a mirror with an operating temperature of greater than 32° C. The production method comprises heating the mirror to a specified temperature of greater than 32° C., measuring the shape of the surface of the mirror with an absolute measurement accuracy of less than 0.1 nm using a measurement arrangement which comprises a diffractive optical element, wherein at least the diffractive optical element has a temperature of less than 25° C., and adapting the surface of the mirror to a desired shape by machining the surface on the basis of the measured surface shape. It is possible with the production method to produce in particular large aspherical mirrors for EUV microlithography, the operating temperature of which is significantly above the environment temperature. In accordance with further embodiments of the production method according to the invention, the measurement arrangement is configured in the form of the previously described measurement arrangement according to the invention or one of its embodiments.

In accordance with an embodiment, the measurement arrangement furthermore comprises a reflective optical element and a capture device, and additionally the reflective optical element and the capture device have a temperature of less than 25° C. during the measurement of the surface shape. In a further embodiment, the absolute measurement accuracy is less than 0.04 nm. It is also possible for the mirror to be heated to a specified temperature of over 35° C., in particular over 40° C.

The production method for a mirror can comprise in particular using a measurement arrangement or a measurement method in accordance with one of the previously described embodiments.

Furthermore provided in accordance with the invention is a mirror having a surface for reflecting extreme ultraviolet radiation, wherein the surface has a deviation from a mirror-symmetric desired shape of less than 0.1 nm RMS at an operating temperature of over 32° C. The mirror-symmetric desired shape is here a free-form surface having a deviation from each rotation-symmetric asphere of more than 5 μm.

RMS here refers to the root mean square. A mirror-symmetric desired shape has at least one plane of symmetry. Consequently, the surface has a mirror-symmetric portion that forms the desired shape and a non-mirror-symmetric portion, with the non-minor-symmetric portion being smaller than 0.1 nm RMS. In particular, the deviation of the mirror-symmetric desired shape from its rotation-symmetric asphere that is best adapted is more than 5 μm or more than 10 μm. A free-form surface is understood to mean a non-rotation-symmetric, non-spherical surface that is describable using polynomials, as is known to a person skilled in the art.

In accordance with an embodiment according to the invention, the deviation of the surface from the minor-symmetric desired shape at an operating temperature of over 32° C. is less than 0.04 nm RMS. In further embodiments, the above-indicated specifications of the surface deviation apply at an operating temperature of over 35° C., in particular of over 40° C.

In accordance with a further embodiment according to the invention, the desired shape has a deviation from each sphere of at least 1 mm. In this case, the optical surface is a large or strong free-form surface.

Furthermore provided according to the invention is a projection lens for microlithography with extreme ultraviolet radiation for imaging mask structures into an image plane. The projection lens according to the invention comprises a mirror heating device for heating at least one minor of the projection lens, wherein the projection lens has, at a temperature of over 32° C. of the at least one mirror, a system wavefront of less than 0.5 nm RMS.

A system wavefront is here understood to mean the maximum deviation of the wave produced by the projection lens at the individual field points in the image plane of the projection lens from a spherical wave. Here, for each field point a deviation of the present wave from an associated spherical wave is determined by forming the root mean square (RMS) of a plurality of measurement points on the wavefront surface.

In accordance with an embodiment of the projection lens according to the invention, the temperature of the at least one mirror is over 35° C. or over 40° C. In further embodiments, at least two mirrors, in particular all mirrors, of the projection exposure apparatus have a temperature of over 32° C., over 35° C. or over 40° C. The projection lens in an embodiment furthermore has, under the stated circumstances, a system wavefront of less than 0.2 nm RMS.

In particular, the mirror heating device can be configured such that the mirror or mirrors always has/have a specified temperature taking into consideration the heat introduced by the exposure radiation. It is possible as a consequence to realize even high outputs of the exposure radiation without the imaging quality being significantly impaired by thermal effects.

The measurement arrangement according to the invention, the measurement method according to the invention and in particular the production method according to the invention make possible the production of a mirror according to the invention. The availability of such a mirror in turn makes possible the production of the projection lens according to the invention.

The features specified in respect of the embodiments, exemplary embodiments and embodiment variants etc. of the method according to the invention, listed above, can be accordingly transferred to the apparatus according to the invention. Conversely, the features specified in respect of the embodiments, exemplary embodiments and embodiment variants of the apparatus according to the invention, in particular of the measurement arrangement according to the invention listed above, can be accordingly transferred to the method according to the invention, in particular the method according to the invention for interferometrically determining a shape of a surface of a test object. These and other features of the embodiments according to the invention are explained in the description of the figures and in the claims. The individual features can be implemented, either separately or in combination, as embodiments of the invention. Furthermore, they can describe advantageous embodiments which are independently protectable and protection for which is claimed if appropriate only during or after pendency of the application.

BRIEF DESCRIPTION OF THE DRAWINGS

The above and further advantageous features of the invention are illustrated in the following detailed description of exemplary embodiments according to the invention with reference to the accompanying schematic drawings. In the figures.

DETAILED DESCRIPTION

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the invention. In order to facilitate the description, a Cartesian xyz-coordinate system is indicated in some drawings, from which system the respective positional relationship of the components illustrated in the figures is evident.

Figure 1:
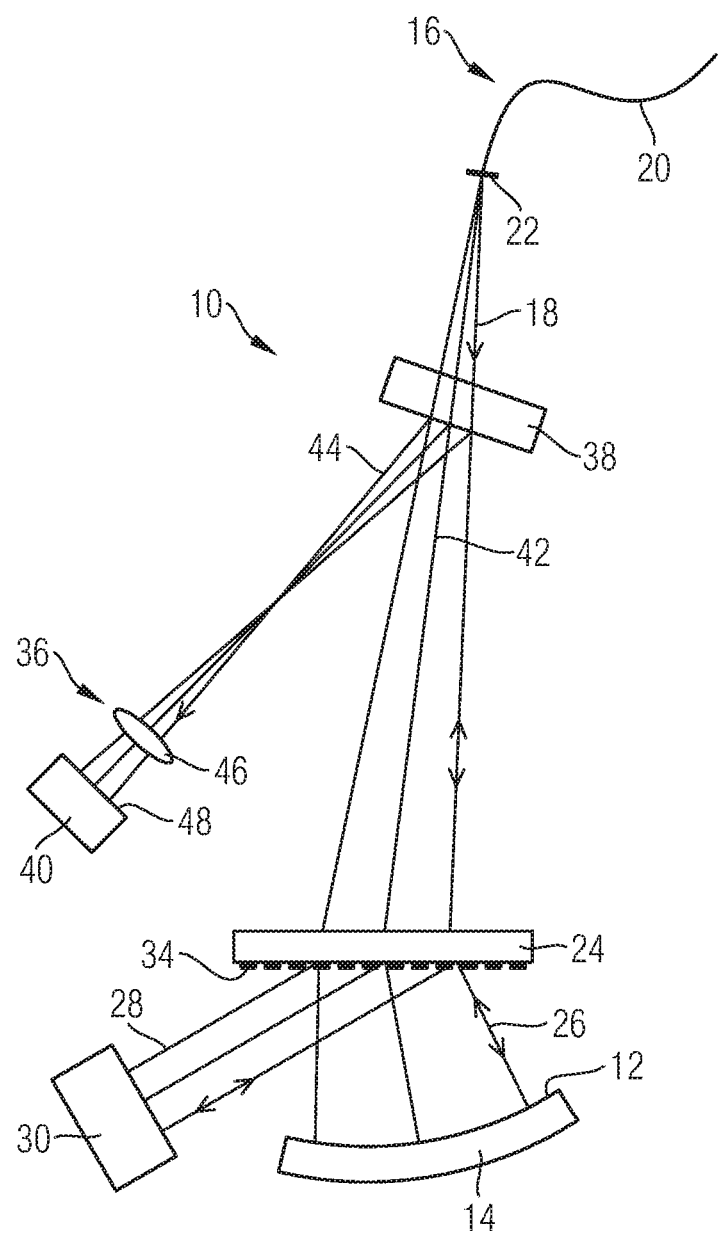
FIG. 1 shows a first exemplary embodiment of a measurement arrangement according to the invention in schematic illustration.

FIG. 1 illustrates an exemplary embodiment of a measurement arrangement 10 for interferometrically determining the shape of an optical surface 12 of a test object 14. The measurement arrangement 10 can be used in particular to determine a deviation of the actual shape of the surface 12 from a desired shape. The test object 14 provided can be, for example, a mirror of a projection lens for EUV microlithography having a non-spherical surface for reflecting EUV radiation at a wavelength of less than 100 nm, in particular a wavelength of approximately 13.5 nm or approximately 6.8 nm, and a mirror temperature of greater than 32° C., in particular greater than 35° C. or greater than 40° C. The non-spherical surface of the mirror can have a free-form surface with a deviation from each rotation-symmetric asphere of more than 5 μm and a deviation from each sphere of at least 1 mm. The previously mentioned mirror temperature corresponds to the operating temperature of the mirror in the exposure operation in a microlithographic projection exposure apparatus. For adjusting the temperature of the mirror, the measurement arrangement 10 can include a heating apparatus (not illustrated in FIG. 1).

The measurement arrangement 10 includes a light source 16 for providing a sufficiently coherent measurement radiation as an input wave 18. In this exemplary embodiment, the light source 16 comprises an optical waveguide 20 having an exit surface 22. The optical waveguide 22 is connected to a radiation source (not illustrated in FIG. 1), e.g. in the form of a laser. By way of example, provision to this end can be made of a helium-neon laser with a wavelength of approximately 633 nm. However, the illumination radiation also may have a different wavelength in the visible or non-visible wavelength range of electromagnetic radiation. The light source 16 with the optical waveguide 20 constitutes merely one example of a light source that may be used for the measurement arrangement. In alternative configurations, rather than the optical waveguide 20, an optical arrangement with lens elements, mirror elements or the like can be provided for providing a suitable input wave 18.

The measurement arrangement furthermore includes a diffractive optical element 24 for producing a test wave 26 and a reference wave 28 from the input wave 18 and a reflective optical element 30 to reflect the reference wave 28. The diffractive optical element 24 is configured in the form of a complex coded CGH and includes diffractive structures 34, which form two diffractive structural patterns 34 that are arranged superposed on one another in a plane. These two diffractive structural patterns can be formed e.g. by a first structural pattern in the form of a bottom grating and a second diffractive structural pattern in the form of a top grating. One of the diffractive structural patterns is configured to produce the test wave 26 with a wavefront that is adapted at least partially to the shape of the optical surface 12. The test wave 26 is here produced by way of, in terms of absolute value, first-order or higher-order diffraction of the input wave 18 at said diffractive structural pattern, such as for example first order of diffraction. The propagation direction of the test wave 26 is tilted by at least 1° with respect to the propagation direction of the input wave 18. The other diffractive structural pattern produces the reference wave 28 having a plane wavefront. This is done by way of, in terms of absolute value, first-order or higher-order diffraction of the input wave 18 at the other diffractive structural pattern, such as for example first order of diffraction. The propagation direction of the reference wave 28 is tilted by at least 1° with respect to the propagation direction of the input wave 18. The reflective optical element 30 is configured in the form of a plane mirror for back-reflection of the reference wave 28 with a plane wavefront. In another configuration, the reference wave 28 can have a spherical wavefront and the reflective optical element can be configured as a spherical mirror.

The measurement arrangement 10 furthermore includes a capture device 36 having a beam splitter 38 for guiding the combination of the reflected test wave 26 and the reflected reference wave 28 out of the beam path of the input wave 18, and an interferometer camera 40 for capturing an interferogram produced by superposing the reference wave 28 on the test wave 26.

The functional principle and the interaction between the components of the measurement apparatus 10 together with a corresponding exemplary embodiment of a method for interferometrically determining the surface shape of the test object 14 will be described below.

The illumination radiation provided by the light source 16 exits the exit face 22 of the optical waveguide 20 in the form of an input wave 18 having a spherical wavefront and propagates divergently along a propagation axis 42 that is directed at the diffractive optical element 24. In the process, the input wave 18 first passes through the beam splitter 38 and then through the diffractive optical element 24. In alternative configurations, a collimator for producing an input wave 18 having a plane wavefront can be provided between the beam splitter 38 and the diffractive optical element 24.

The diffractive optical element 24, which is configured as a complex coded CGH, produces in transmission by way of diffraction at one of the diffractive structural patterns arranged superposed on one another from the input wave 18 the test wave 26 which is directed at the surface 12 of the test object 14 and has a wavefront that is adapted to a desired shape of the surface 12. During this transformation, the wavefront is adapted such that the test wave is perpendicularly incident at each location of a surface in a desired shape and is reflected back on itself.

The test wave 26 propagates in the direction of the test object 14 and next is incident, after it is produced at the diffractive optical element 24, on the optical surface 12 of the test object 14. The test wave 26 is reflected by the surface 12 back to the diffractive optical element 24 and is diffracted again upon passage through the diffractive structures 34. The order of diffraction is here the same as the order of diffraction used when the test wave 26 was produced by diffracting the input wave 18, for example the first order of diffraction. Due to the further diffraction of the test wave at the optical element 24, the reflected test wave 26 is transformed back into an approximately spherical wave, wherein the wavefront thereof has, due to deviations of the surface 12 of the test object 14 from the desired shape, corresponding deviations from a spherical wavefront. However, these deviations are not greater than 10 μm.

The diffractive optical element 24 furthermore produces in transmission by way of diffraction at the other one of the diffractive structural patterns from the input wave 18 the reference wave 28 which is directed at the reflective optical element 30. The reference wave 28 here has a propagation direction that deviates from the propagation direction of the test wave 26 and a wavefront that is adapted to the surface shape of the reflective optical element 30. In this exemplary embodiment, the reflective optical element 30 is configured as a plane mirror and the reference wave has a plane wavefront due to the transformation at the diffractive optical element 24. In different configurations, a convex or concave spherical mirror can be provided as the reflective optical element and a corresponding adaptation of the wavefront of the reference wave can be performed.

After the reference wave 28 is produced at the diffractive optical element 24, it is incident next on the reflective optical element 30 and is reflected back on itself thereby. In this case no further optical elements are situated in the beam path of the reference wave 28 or in the beam path of the test wave 26. The reflected reference wave 28 again passes through the diffractive optical element 24 and is diffracted again. The order of diffraction is here the same as the order of diffraction used when the reference wave 28 was produced by diffracting the input wave 18, for example the first order of diffraction. Due to the further diffraction of the reflected reference wave 28 at the optical element 24, the reflected reference wave 28 is transformed back into a spherical wave. In an alternative configuration using a collimator in the beam path of the input wave 18 for producing an input wave having a plane wavefront and a plane mirror as the reflective optical element 30, the wavefront of the reference wave 28 does not need to be adapted by way of the diffractive optical element 24. In a further, alternative configuration (not illustrated in a drawing) using a collimator in the beam path of the input wave 18 for producing an input wave having a plane wavefront and a plane mirror as the reflective optical element 30, only the direction of the plane wavefront of the reference wave 28 is adapted by way of the diffractive optical element 24.

The diffractive optical element 24 therefore also serves for superposing the reflected reference wave 28 on the reflected test wave 26. Both waves are incident on the beam splitter 38 as convergent beams 44 and are reflected thereby in the direction of the interferometer camera 40. Both convergent beams 44 travel through an eyepiece 46 and are ultimately incident on a capture plane 48 of the interferometer camera 40. The interferometer camera 40 can be configured for example in the form of a CCD sensor and captures an interferogram produced by the interfering waves. Arranged in the focus of the convergent beams 44 can be a stop (not illustrated in FIG. 1) as a spatial filter for reducing scattered radiation. The situation of the reflected test wave 26 and of the reflected reference wave 28 after the further diffraction at the diffractive optical element 24 can also be described in that the two reflected waves 26 and 28 form a common return wave after the further diffraction. The propagation direction of the return wave in accordance with an embodiment is tilted with respect to the reverse propagation direction of the input wave 18 in the region in front of the diffractive optical element 24 by less than 1°.

An evaluation device (not illustrated in FIG. 1) of the measurement arrangement 10 determines from the captured interferogram the actual shape of the optical surface 12 of the test object 14. To this end, the evaluation device has a suitable data processing unit and uses corresponding calculation methods known to a person skilled in the art. Alternatively or additionally, the measurement apparatus 10 can have a data memory or an interface with a network to make possible a determination of the surface shape using the interferogram that is stored or transmitted via the network by way of an external evaluation unit. In the determination of the surface shape, the evaluation unit in particular takes into account a result of a calibration of the diffractive element 24 or of the complex coded CGH. An exemplary embodiment of such calibration will be described further below.

By using the mutually superposed diffractive structural patterns of the diffractive optical element 24 to produce the test wave 26 and the reference wave 28 in transmission and to superpose these waves, after reflection at the test object 14 and at the reflective optical element 30, respectively, it is possible to measure test objects that are in particular warmer than the environment with high accuracy. Here, the measurement arrangement 10 and in particular the diffractive optical element 24 can be operated at room temperature of less than 25° C., in particular approximately 22° C. Inhomogeneities in the diffractive optical element 24, which are caused by thermal radiation of the warm test object 14, have the same effect on the reference wave 28 and the test wave 26 and cancel each other out in the interferometric measurement using the measurement arrangement 10. Unevennesses in the diffractive optical element 24, which are caused by thermal radiation of the warm test object 14, have the same effect on the reference wave 28 and the test wave 26, as a result of which the effect of the unevennesses on the interferometric measurement using the measurement arrangement 10 is reduced.

Figure 2:
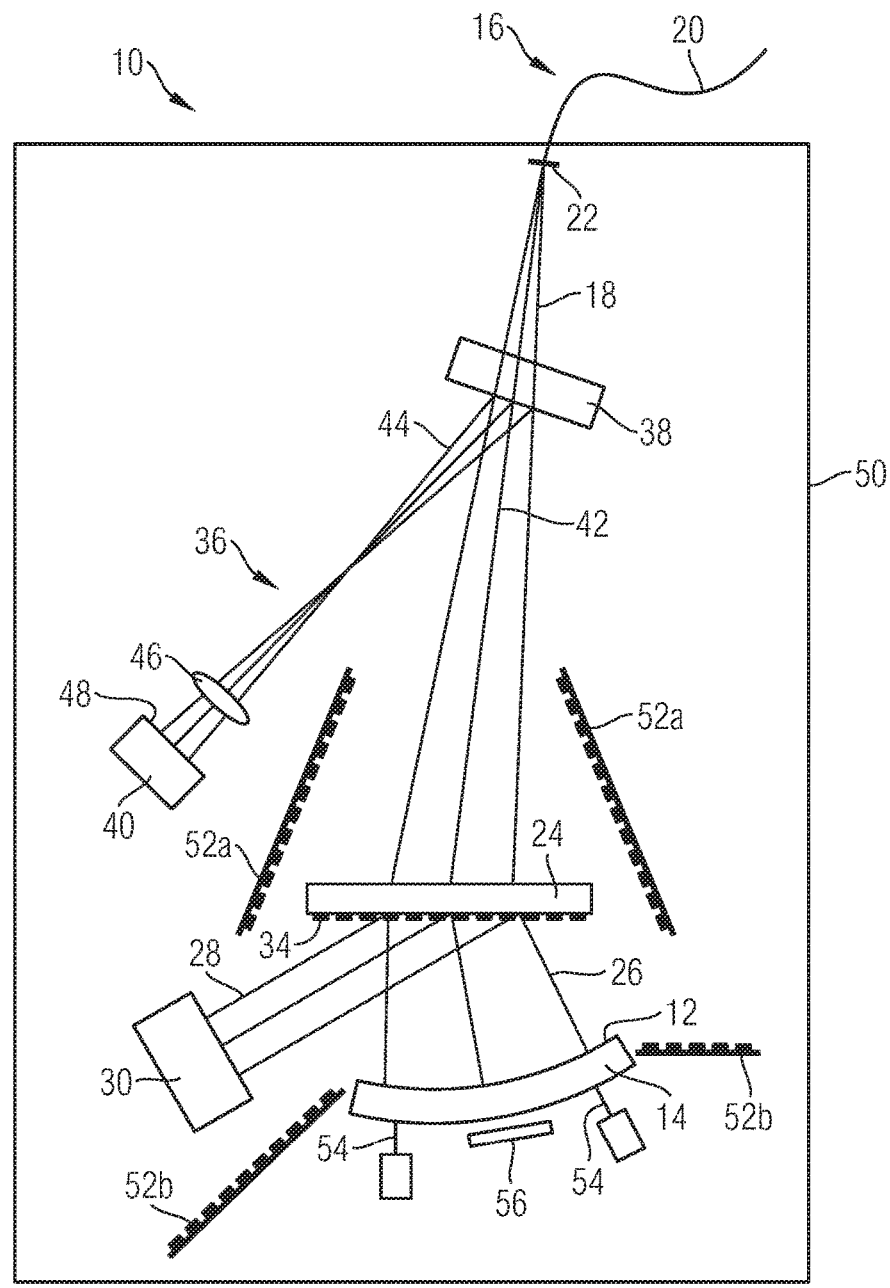
FIG. 2 shows a second exemplary embodiment of a measurement arrangement according to the invention having heat shields and a vacuum environment in a schematic illustration, FIGS. 3A and 3B each show an exemplary embodiment of a measurement arrangement having a tiltably or a displaceably mounted reflective optical element in a schematic detail view.

FIG. 2 shows a second exemplary embodiment of a measurement arrangement 10. The measurement arrangement 10 largely corresponds to the measurement arrangement of FIG. 1, but is additionally arranged in a vacuum chamber 50. The vacuum chamber 50 is filled with air at a pressure of less than 100 mbar. Such a vacuum has only a minor temperature-dependent change in refractive index. Alternatively, the vacuum chamber 50 can be filled with helium at atmospheric pressure. Also in the case of helium, only a minor temperature-dependent change in refractive index takes place.

The measurement arrangement 10 furthermore comprises a plurality of heat shields 52. By way of example, two such heat shields 52a are arranged by the diffractive optical element 24 and protect it against thermal radiation from heat sources. In corresponding fashion, heat shields can also be provided by the reflective optical element 30. Two further heat shields 52b are arranged in the proximity of heat sources, such as for example a positioning drive 54 or a heating apparatus 56 for the test object 14. The heat shields 52 in each case have on one side a coating made of a material that absorbs thermal radiation and on the other side a coating made of a material that strongly reflects thermal radiation, such as gold. The heat shields 52 are furthermore arranged each such that the side having the heat-absorbing coating faces the diffractive optical element 24 or the reflective optical element 30 of the measurement apparatus 10.

The heating apparatus 56 makes possible heating of the test object 14 to a specified temperature, such as for example the previously mentioned intended operating temperature of the test object 14 in exposure operation in a microlithographic projection exposure apparatus. In particular, the heating apparatus 56 is designed for heating the test object 14 to a specified temperature of greater than 32° C. Here, the heating apparatus 56 regulates the temperature of the test object at least during measurement to the specified temperature and to this end includes e.g. temperature sensors of suitable design.

The substrates of the diffractive optical element 24 and of the reflective optical element 30 furthermore include an optical material having a coefficient of thermal expansion of, in terms of absolute value, at most $0.5 \times 10^{-6}$ K$^{-1}$ in the temperature range from 5° C. to 35° C. In particular, the substrates can in each case have an optical material having a coefficient of thermal expansion of, in terms of absolute value, at most $0.05 \times 10^{-6}$ K$^{-1}$ in a temperature range from 0° C. to 50° C. Examples of such an optical material comprise Zerodur® or ULE® glass (Ultra Low Expansion Glass).

When heating the substrate of a CGH, in particular the thermal expansion and the temperature dependence of the refractive index must be taken into account. A thermal expansion parallel to the plane of the diffractive structures 34 substantially results in a lateral displacement of individual structures, which cause additional phase contributions in particular in the case of high fringe densities. At fringe densities of more than 800 lines/mm, a substrate material having a very small coefficient of thermal expansion, such as the previously mentioned Zerodur® and ULE® glass (Ultra Low Expansion Glass), is therefore preferably used for the diffractive optical element 24.

It is possible due to heating in particular for the optical path length through the diffractive optical element 24 to change vertically with respect to the plane of the diffractive structures 34. This occurs due to a vertical expansion of the diffractive optical element 24 or due to a temperature-dependent refractive index of the substrate of the diffractive optical element 24. This effect dominates for smaller fringe densities and frequently at a wavelength of the input wave 18 in the visible spectral range. In this case, an athermal optical material, such as calcium fluoride (CaF$_2$) or P-PK53, a product from Schott AG, is preferably used for the substrate of the diffractive optical element 24. Referred to as an athermal optical material is a material in which temperature-related changes in the refractive index and expansion of the material at least partially are compensated in terms of their optical effect. These materials have a small thermo-optical constant $G = \alpha \cdot (n-1) + dn/dT$ with a coefficient of thermal expansion a, a refractive index n and a temperature coefficient of the refractive index dn/dT. The optical path length in these materials is thus largely independent of the temperature. In further exemplary embodiments, the substrate can also be made of a plurality of layers of different materials, e.g. of quartz and CaF$_2$ in alternating fashion, in order to achieve an athermal effect. The layer thicknesses can here be adjusted in dependence on the fringe density in order to minimize the above-mentioned effects due to lateral and vertical expansion. CaF$_2$ furthermore has a high thermal conductivity, as a result of which quick thermalization takes place at local temperature changes. Table 1 lists some thermal properties of above-mentioned materials.

TABLE 1

| | Thermal properties | | | |
|---|---|---|---|---|
| Material | dn/dT$_{absolute}$ (+20/+40° C., λ ≈ 546 nm) [10$^{-6}$ K$^{-1}$] | Coefficient of thermal conductivity [W/mK] | α *(-30/+70° C.) **(-0/+50° C.) [10$^{-6}$ K$^{-1}$] | G (λ ≈ 546 nm) [10$^{-6}$ K$^{-1}$] |
| CaF$_2$ | −11.40 | 9.71 | 18.43* | −3.38 |
| P-PK53 | −6.50 | 0.64 | 13.31* | 0.54 |

TABLE 1-continued

| | Thermal properties | | | |
|---|---|---|---|---|
| Material | dn/dT$_{absolute}$ (+20/+40° C., λ ≈ 546 nm) [10$^{-6}$ K$^{-1}$] | Coefficient of thermal conductivity [W/mK] | α *(-30/+70° C.) **(-0/+50° C.) [10$^{-6}$ K$^{-1}$] | G (λ ≈ 546 nm) [10$^{-6}$ K$^{-1}$] |
| Quartz | 10.00 | 1.38 | 0.5* | 10.23 |
| Zerodur® | 13.40 | 1.38 | 0.05** | 13.42 |

Figure 3A:
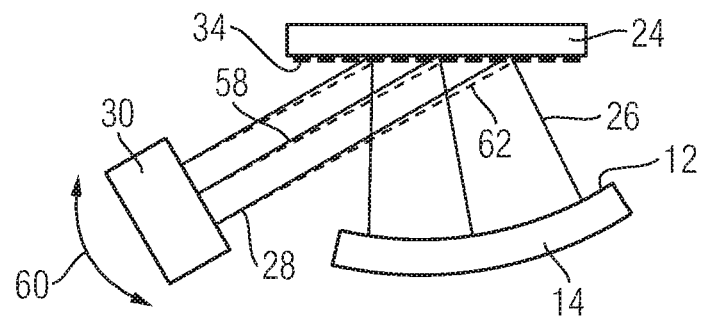

FIG. 3A illustrates the lower portion of the measurement arrangement 10 according to FIG. 1, comprising the diffractive optical element 24 and the reflective optical element 30, in a design variant having a reflective optical element 30 that is mounted such that it is tiltable in a schematic detail view. The reflective optical element 30 is mounted such that it is rotatable about an axis perpendicular to the optical axis or propagation direction 58 of the reference wave 28. By rotating (arrow 60) the reflective optical element 30, the reflected reference wave 62 is tilted with respect to the reflected test wave 26. For example a piezoelement can be provided for such a rotation. The measurement arrangement 10 can in this way be used for a multi-fringe interferometry or what is known as displaced-measurement interferometry (DMI). The inclination of the reflected reference wave 62 with respect to the reflected test wave 26 results in a fringe pattern, which represents a spatial carrier wave, in the capture plane 48 due to the position-dependent phase shift. The frequency of the carrier wave is here dependent on the inclination angle. Local phase shifts of the test wave 26 due to deviations of the surface 12 of the test object 14 from a desired shape effect spatial modulation of the carrier wave or of the fringe pattern. The shape of the surface 12 can be calculated with high accuracy from the modulation of the carrier wave. Alternatively to tilting the reflective optical element 30, the reflected reference wave 62 can also be inclined with respect to the test wave 26 by way of a corresponding formation of the diffractive structural pattern of the diffractive optical element 24 that produces the reference wave 28. Multi-fringe interferometry is described for example in U.S. Pat. No. 5,361,312.

Figure 3B:
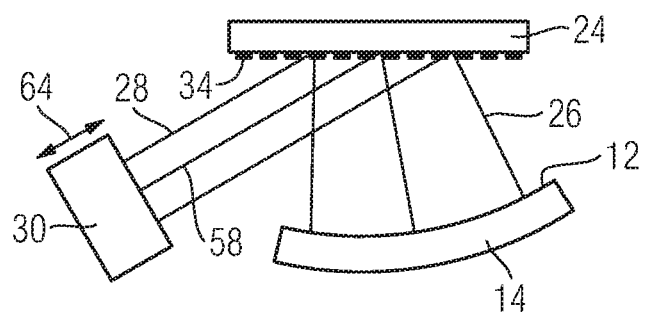

FIG. 3B shows the lower portion of the measurement arrangement 10 according to FIG. 1, comprising the diffractive optical element 24 and the reflective optical element 30, in an embodiment with a plane mirror as the reflective optical element 30, which is mounted such that it is displaceable along the optical axis or propagation direction 58 of the reference wave 26 (arrow 64). In particular, the reflective optical element 30 is displaceable in increments in fractions of the wavelength of the reference wave 26 or continuously. A piezoelement can be used herefor, for example. With this measurement arrangement 10, phase shift interferometry can be performed. Here, interferograms are captured in the capture plane 48 sequentially at different positions of the reflective optical element 30 and thus different phase shifts of the reference wave 26. The phase shift is positionally independent in the capture plane 48 and changes over time. Instead of the above-mentioned spatially modulated carrier wave, a temporally modulated carrier wave is produced. It is possible to uniquely determine from a plurality of interferograms from the intensities captured at a point the phase shift of the test wave 26 at that point. It is therefore also possible with this method to measure with high accuracy the surface 12 of the test object 14. Phase shift interferometry is likewise described in U.S. Pat. No. 5,361,312.

Figure 4:
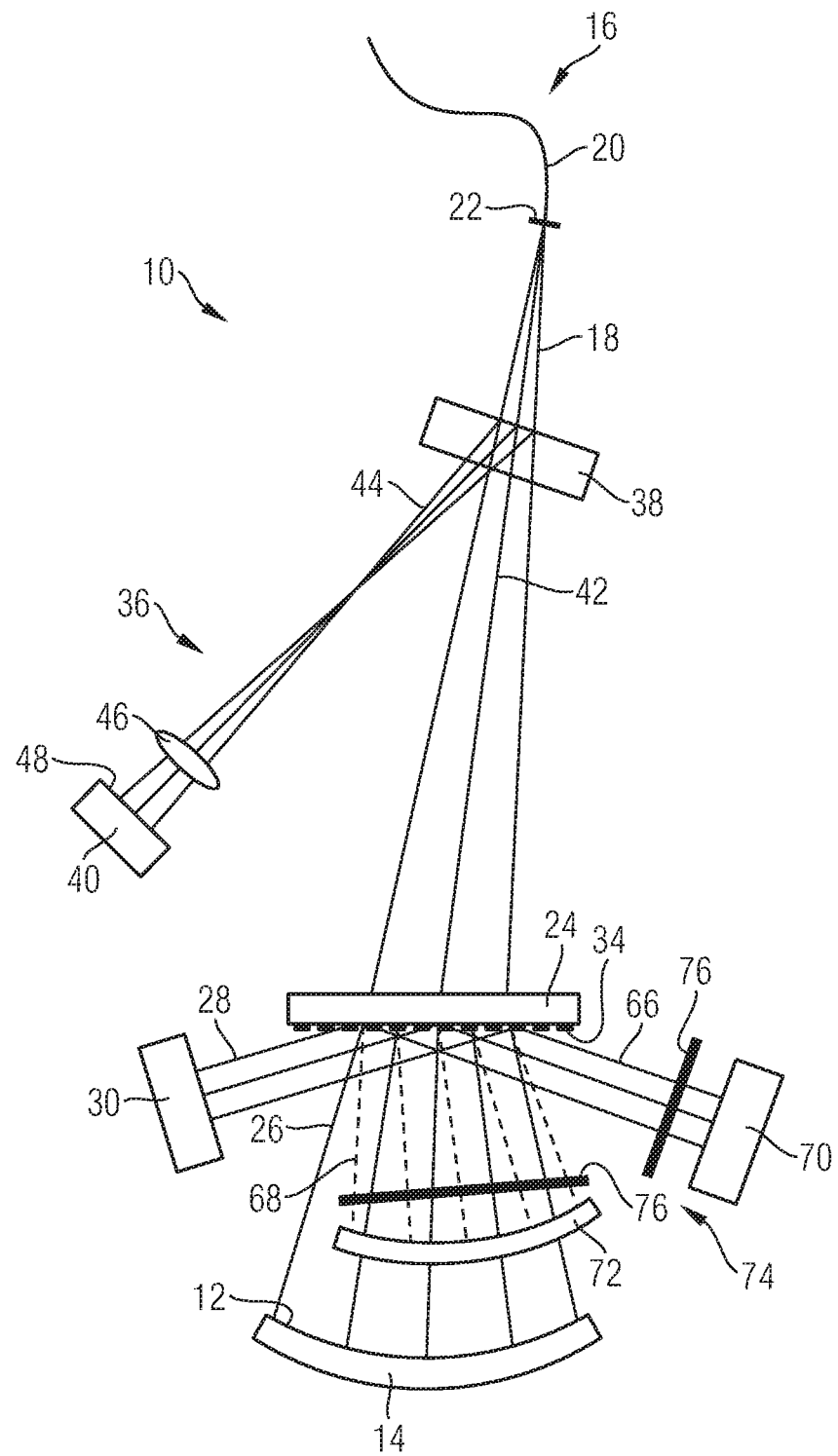
FIG. 4 shows a third exemplary embodiment of the measurement arrangement having a plane and a spherical calibration mirror in schematic illustration.

FIG. 4 shows a schematic view of a further measurement arrangement 10. In contrast to the measurement arrangement of FIG. 1, the measurement arrangement 10 includes a complex coded CGH as a diffractive optical element 24, which produces from the input wave 18 in transmission by way of diffraction, in addition to the test wave 26 and the reference wave 28, a calibration wave 66 with a plane wavefront and a calibration wave 68 with a spherical wavefront. Both the plane calibration wave 66 and the spherical calibration wave 68 have in each case a propagation direction that deviates from all other waves. The diffractive optical element 24 can for this purpose comprise diffractive structures 34, which form four diffractive structural patterns arranged in superposed fashion in a plane. Such a diffractive optical element is disclosed for example in DE 10 2012 217 800 A1. Here, the different diffractive structural patterns are formed by individual phase functions of a complex coded phase grating.

Arranged in the beam path of the plane calibration wave 66 is a plane calibration mirror 70. The plane calibration mirror 70 reflects the plane calibration wave 66 back on itself. Furthermore arranged in the beam path of the spherical calibration wave 68 is a spherical calibration mirror 72. The spherical calibration mirror 72 is configured such that it reflects the spherical calibration wave 68 back on itself. Furthermore provided in the beam path of the plane calibration wave 66 and of the spherical calibration wave 68 is a closure apparatus 74, which selectively allows passage of either the plane calibration wave 66 or the spherical calibration wave 68. To this end, the closure apparatus 74 has one or two suitably designed shutters 76. In this way, it is possible in a calibration to quickly change between the plane calibration wave 66 and the spherical calibration wave 68.

In the embodiment shown in FIG. 4, the test object 14 is removed from the beam path of the test wave 26 in the course of a calibration. In corresponding fashion, the spherical calibration mirror 72 is removed from the beam path of the spherical calibration wave 68 in the course of a measurement of the test object 14. In an alternative configuration, with suitable formation of the test object 14, of the spherical calibration mirror 72 and of the diffractive optical element 24, the spherical calibration mirror 72 can remain in its position during the measurement of the test object 14. In this case, the spherical calibration wave 68 as with the plane calibration wave 66 is blocked by the closure apparatus 74 during the measurement of the test object 14. Calibration of the diffractive optical element 24 with two calibration waves 66, 68 is possible with high accuracy. As a result, it is possible with the measurement apparatus 10 according to FIG. 4 to perform a highly accurate measurement of the surface shape of free-form surfaces, in particular with an absolute measurement accuracy of less than 0.04 nm.

Figure 5:
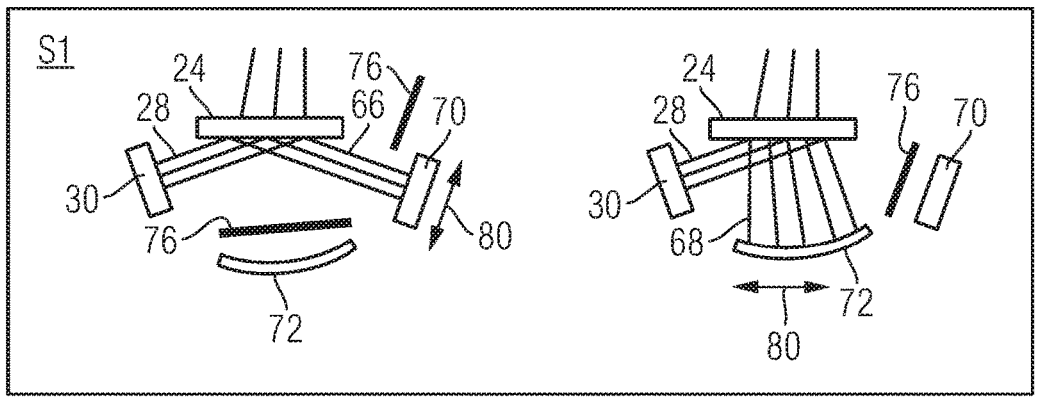
FIG. 5 shows an illustration of an exemplary embodiment of a method according to the invention for determining a surface shape using the measurement arrangement of FIG. 4 in schematic illustration.
Figure 5:
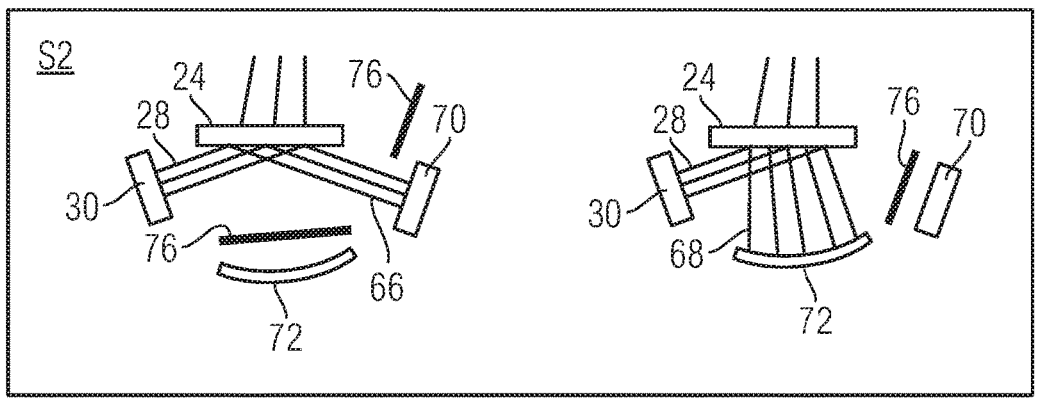
Figure 5:
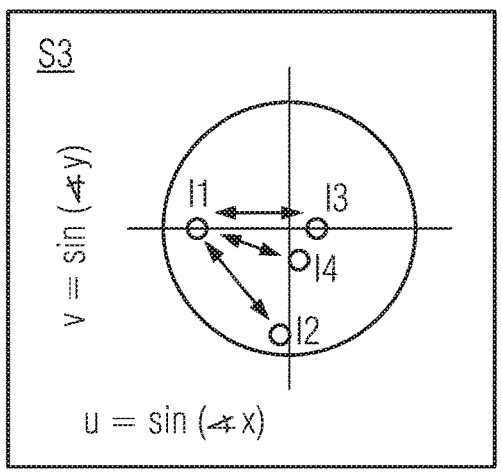
Figure 5:
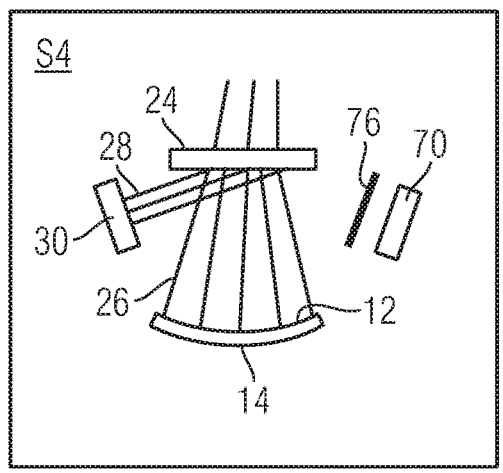

FIG. 5 shows an exemplary embodiment of a method according to the invention for determining a surface shape of the test object 14 using the measurement arrangement 10 of FIG. 4 in schematic illustration. Individual steps are framed in FIG. 5. Since the measurement arrangement 10 uses the diffractive optical element 24 to produce a reference wave and therefore does not contain a Fizeau element, it is necessary for a calibration to measure the reflective optical element 30 that is configured as a plane reference mirror, the plane calibration mirror 70 and the spherical calibration mirror 72 with respect to one another. In this exemplary embodiment, the reflective optical element 30 is used during a measurement of the test object 14 for back-reflection of the reference wave 28. Use of the plane calibration mirror 70 or of the spherical calibration mirror 72 as a reference mirror is alternatively also possible during a measurement.

To determine the surface 12 of the test object 14, first a highly accurate calibration of the errors of the diffractive optical element 24 is performed. To this end, in a first step S1, the surface defects R1 of the reflective optical element 30 that is in the form of a plane reference mirror, the surface defects R2 of the plane calibration mirror 70 and the surface defects R3 of the spherical calibration mirror 72 are determined. To this end, for example a shift-rotation method can be used, such as is described for example in "Absolute surface figure testing by shift-rotation method using Zernike polynomials," Su et al., Optics Letters, Vol. 37, Issue 15, pages 3198-3200 (2012). In this method, the respective optical element is interferometrically measured in different rotational positions with respect to its optical axis and different positions along the optical axis using the capture device 36. Alternatively, it is also possible in the case of a convex spherical calibration mirror 72 to use the method described in "Absolute testing of the reference surface of a Fizeau interferometer through even/odd decompositions," R. Schreiner et al., Applied Optics, Vol. 47, No. 32, 10 Nov. 2008. FIG. 5 schematically indicates by way of the arrow 80 the determination of the surface defects of the plane calibration mirror 70 and of the spherical calibration mirror 72. Here, the shutters 76 only allow the corresponding calibration wave 66 or 68 to pass in each case.

In a second step S2, the capture device 36 is subsequently used to measure the wavefront difference dWFR21 between the calibration wave 66 reflected at the plane calibration mirror 70 and the reference wave 28 reflected at the plane reference mirror 30. Here, the shutters 76 only allow the plane calibration wave 66 to pass and block the spherical calibration wave 68. The wavefront difference dWFR31 between the calibration wave 68 reflected at the spherical calibration mirror 72 and the reference wave 28 reflected at the plane reference mirror 30 is measured in a corresponding fashion. Here, the plane calibration wave 66 is blocked by the shutter 76. The wavefront differences are made up of the respective surface defects R1 and R2, and R1 and R3, and the corresponding interferometer errors I1 for the plane reference mirror 30, I2 for the plane calibration mirror 70 and I3 for the spherical calibration mirror 72. The interferometer errors I1, I2 and I3 describe the systematic error of the measurement arrangement 10 and are substantially caused by grating errors of the diffractive optical element 24. The following holds true:

$$I2-I1=dWFR21-R2-R1 \text{ and } I3-I1=dWFR31-R3-R1$$

The interferometer errors I1, I2 and I3 designate a respective phase deviation of the rays reflected by the respective optical elements from the ideal wavefront. For example, I1 designates the phase deviation of the reference wave 28 reflected by the plane reference mirror 39, I2 designates the direction deviation of the calibration wave 66 reflected by the plane calibration mirror 70, and I3 designates the direction deviation of the calibration wave 68 reflected by the spherical calibration mirror 72.

The interferometer errors I1, I2 and I3 can therefore be represented by respective coordinates in the directional space, which is defined by the coordinate axes u and v, as is illustrated in the drawing of FIG. 5 that is associated with step S3. The coordinate axes u and v are here the sine of the angle of corresponding rays after the diffractive optical element 24 and thus represent pupil coordinates. In step S3, a correction plane is determined by the respective points I1, I2, I3 in the directional space in each local point on the diffractive element 24. The coordinate values of the points I1, I2 and I3 can be determined from the optical design of the diffractive optical element 24. It is possible by way of the selection of the plane reference mirror 30 as the reference mirror for measurement for the interference error I1 to be set to I1=0. A correction plane finally provides the needed interferometer error 14 as a calibration correction for the test object 14:

$$I4=f(u1,v1,I1=0,u2,v2,I2,u3,v3,I3,u4,v4)+\text{remainder}$$

Non-linear corrections are here designated the remainder, because electromagnetic grating calculations show that the linear model merely represents an approximation.

In step S4, a measurement of the surface shape of the test object 14 is finally performed. To this end, the spherical calibration mirror 72 is removed, the test object 14 is positioned in the measurement arrangement 10, and the plane calibration wave 66 is blocked by the shutter 76. During the measurement, the capture device 36 is used to measure the wavefront difference dWFR41 between the test wave 26 and the reference wave 28. For R4 as the surface defects of the test object and as deviation from the desired shape, the following holds true:

$$R4=dWFR41-(I4-I1) \text{ (with } I1=0)$$

The deviation of the surface 12 of the test object 14 from the desired shape and thus the shape of the surface 12 is determined with high accuracy by correction of the interferometric measurement with the interferometer error 14 that was determined by the calibration.

Figure 6:
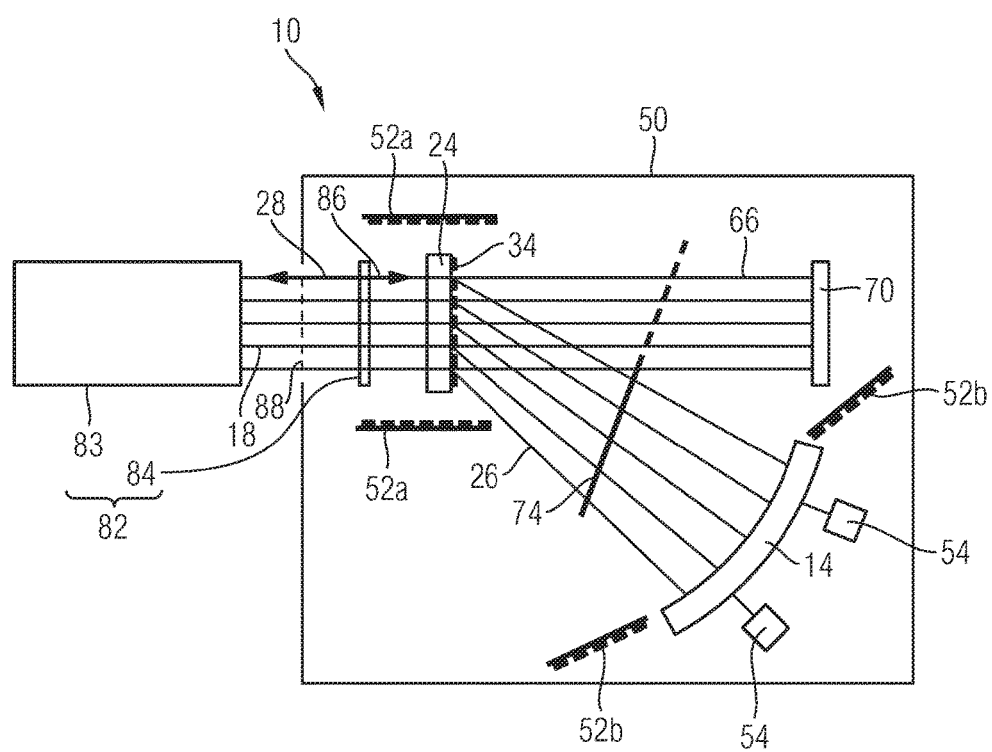
FIG. 6 shows a further exemplary embodiment of a measurement arrangement for interferometrically determining a surface shape in schematic illustration.

FIG. 6 shows a further interferometric measurement arrangement 10 for determining the shape of the surface 12 of a test object 14. In particular, the measurement apparatus 10 permits calibration during a measurement operation and is therefore also suitable for measuring test objects 14 that are warmer than the environment, such as e.g. EUV mirrors at operating temperature. The measurement arrangement 10 comprises an interferometer 82 having a Fizeau element 84, a diffractive optical element 24 having a CGH, and a plane calibration mirror 70.

The interferometer 82 is configured in the form of a Fizeau interferometer and comprises a single-beam/detection module 83 and the Fizeau element 84. The structure and functionality of such an interferometer are known to a person skilled in the art. The single-beam/detection module 83 in particular includes a light source for producing illumination radiation that is sufficiently coherent for interferometric measurements. By way of example, the illumination radiation is formed into a collimated beam with a plane wavefront as the input wave 18 by a collimator. The input wave 18 is incident on the Fizeau element 84. A component of the input wave 18 is reflected back by a Fizeau surface of the Fizeau element 84 in the form of a reference wave 28. Another component of the input wave 18 continues to propagate as the measurement wave 86.

The measurement wave 86 subsequently passes through the simply coded CGH of the diffractive optical element 24. The diffractive optical element 24 produces from the measurement wave 86 in the zero order of diffraction a calibration wave 66 with a plane wavefront and in the first order of diffraction a test wave 26 with a wavefront that is adapted to a desired shape of the surface 12 of the test object 14. Arranged in the beam path of the test wave 26 is the test object 14. In a measurement mode, the test wave 26 is reflected back by the surface 12. Arranged in the beam path of the calibration wave 66 is the plane calibration mirror 70. The back-reflected test wave 26 travels through the diffractive optical element 24 and the Fizeau element 84 back into the interferometer 82 and is here superimposed by the reference wave 28. An interferogram that is produced in the process is captured by an interferometer camera. In alternative configurations, a Michelson interferometer, a Twyman-Green interferometer or any other suitable interferometer may be used as the interferometer.

In a calibration mode, the calibration wave 66 is reflected back on itself by the plane calibration mirror 70. Furthermore arranged in the beam path of the test wave 26 and of the calibration wave 66 is a closure apparatus 74, which selectively allows passage of either the test wave 26 for measurement or the calibration wave 66 for calibration. To this end, a shutter or two shutters which are matched to one another can be used, for example.

During measurement, the test wave 26 reflected by the surface 12 of the test object 14 travels back into the interferometer 82 and is measured to determine the surface shape by superimposition with the reference wave 28. During the calibration, the calibration wave 66 reflected by the plane calibration mirror 70 correspondingly travels back into the interferometer 82 and is measured to calibrate the diffractive optical element 24. Using the closure apparatus 74, it is possible during a measurement operation to very quickly switch to calibration mode. In this way, changes in optical properties of the diffractive optical element 24 caused by the warm test object 14 can be captured during operation and be taken into consideration in an evaluation of a surface measurement of the test object 14.

In an alternative exemplary embodiment, rather than providing the simply coded CGH, a complex coded CGH is provided as the diffractive optical element 24 to produce a calibration wave having a spherical wavefront. The spherical calibration wave is reflected back by a convex spherical calibration mirror. Such a mirror takes up less space than the plane calibration mirror. The measurement arrangement 10 can thereby be realized in a space-saving manner. In a further exemplary embodiment, a second calibration mirror can furthermore be provided for calibrating the diffractive optical element 24.

In a manner corresponding to the measurement arrangement of FIG. 2, the measurement arrangement 10 according to FIG. 6 can be arranged in a vacuum chamber 50. The input wave 18 of the interferometer 82 is guided through a suitably configured window 88 into the vacuum chamber 50. The measurement arrangement 10 also includes heat shields 52 for protecting the diffractive optical element 24 against thermal radiation from heat sources, such as for example against thermal radiation that is emitted by positioning drives 54. As in the measurement arrangement according to FIG. 2, the substrate of the diffractive optical element 24 and the substrate of the calibration mirror 70 preferably contain a material having a very small coefficient of thermal expansion or an athermal optical material. For a further description of these features, reference is made to the description of the measurement arrangement 10 according to FIG. 2.

An exemplary embodiment of a production method according to the invention for a mirror having an operating temperature of over 32° C. for a projection lens of a microlithographic projection exposure apparatus provides in a step production of a mirror having a surface that is approximated according to the production accuracy to a specified desired shape, e.g. a specified free-form surface. Subsequently, the mirror is heated to the specified temperature of over 32° C. Alternatively, heating can already take place during or before the production of the mirror with approximated surface shape. In a further step, measurement of the shape of the surface of the mirror is performed with a measurement accuracy of less than 0.1 nm RMS. To this end, an interferometric measurement arrangement 10 in one of the previously described embodiments having a diffractive optical element 24, a reflective optical element 30 and a capture device 36 is used, wherein at least the diffractive optical element 24 has a temperature of less than 25° C., in particular room temperature. In addition, the reflective optical element and the capture unit can also have a temperature of less than 25° C. After the measurement, based on the measurement result, the surface is post-machined at suitable locations, with the result that it corresponds to the desired shape with sufficient accuracy at a temperature of over 32° C. In further exemplary embodiments, provision may be made for a repetition of the steps of measuring and post-machining. The absolute measurement accuracy can also be less than 0.04 nm RMS or the mirror can be heated to a temperature of over 35° C. or over 40° C.

The exemplary embodiments described of the measurement arrangement 10, of the measurement method or of the production method make possible production of the mirror according to the invention, for example a highly accurate EUV mirror having a free-form surface and an operating temperature of greater than 32° C. The availability of such a mirror in turn permits the production of a projection lens 210 according to the invention, according to FIG. 8.

Figure 7:
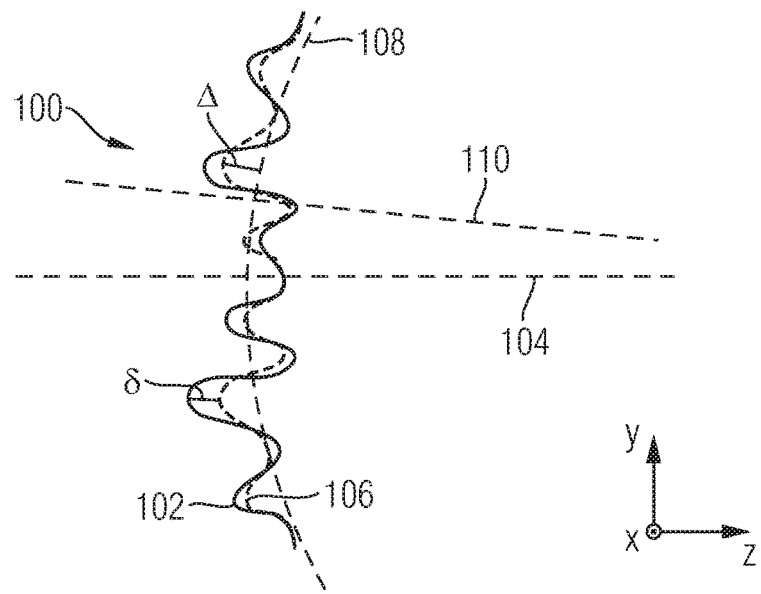
FIG. 7 shows an exemplary embodiment of a mirror according to the invention in schematic illustration.

FIG. 7 shows an exemplary embodiment of a mirror 100 according to the invention in a schematic sectional view. The mirror 100 is configured for reflection of EUV radiation having a wavelength of <100 nm, in particular a wavelength of approximately 13.5 nm or approximately 6.8 nm, at a mirror temperature of over 32° C. To this end, the mirror 100 has a surface 102, which reflects EUV radiation e.g. by way of a corresponding coating. Alternatively, the provided operating temperature can be a mirror temperature of over 35° C. or over 40° C. FIG. 7 shows a cross-section of the mirror 100 perpendicular to the plane of symmetry 104 of a mirror-symmetric desired shape 106. The plane of symmetry 104 in FIG. 7 is arranged parallel to the xz-plane and consequently perpendicular to the drawing plane. The desired shape 106 has the form of a mirror-symmetric free-form surface and is not rotation-symmetric. FIG. 7 furthermore illustrates a rotation-symmetric asphere 108, having a rotational axis 110, which is best adapted to the desired shape. Deviations of the surface 102 from the desired shape 106 and the desired shape 106 from asphere 108 are shown in highly enlarged fashion for illustrative purposes.

The maximum deviation Δ of the desired shape 104 from the best adapted rotation-symmetric asphere 106 with the rotational axis 110 in this exemplary embodiment is approximately 6 μm and is thus greater than 5 μm. In alternative exemplary embodiments, the maximum deviation Δ of the desired shape 106 can be over 10 μm or have a deviation from each sphere of at least 1 mm. The maximum deviation δ of the actual surface 102 from the desired shape 106 is, at the operating temperature of over 30° C., 0.09 nm RMS and is therefore less than 0.1 nm RMS. In further exemplary embodiments, the maximum deviation δ of the surface 102 even at over 35° C. or over 40° C. is less than 0.1 nm RMS or less than 0.04 nm RMS.

Figure 8:
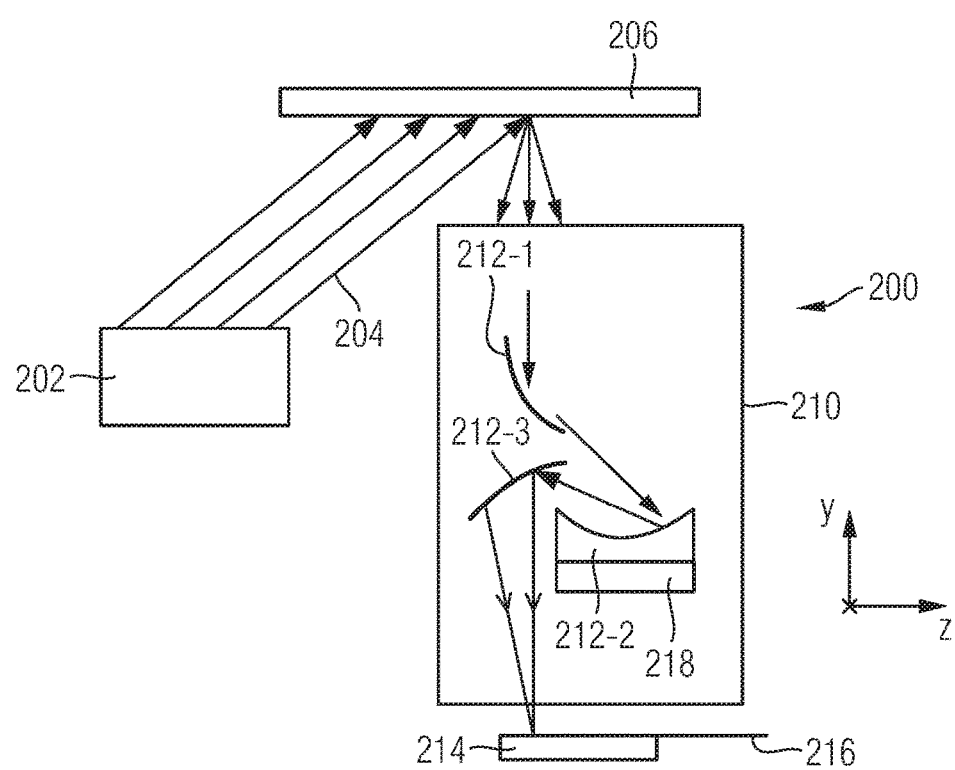
FIG. 8 shows an exemplary embodiment of a projection exposure apparatus having a projection lens according to the invention in schematic illustration.

FIG. 8 shows an exemplary embodiment of a microlithographic projection exposure apparatus 200 having a projection lens 210 according to the invention in schematic illustration. The projection lens 210 includes at least one mirror 212-2 according to one of the exemplary embodiments of FIG. 7. In particular, the mirror 212-2 has been produced using the measurement apparatus 10 according to the invention or the production method in accordance with one of the previously described exemplary embodiments.

The projection exposure apparatus 200 comprises an illumination system 202 for producing exposure radiation 204 in the form of EUV radiation (extreme ultraviolet radiation) having a wavelength of <100 nm, in particular a wavelength of approximately 13.5 nm or approximately 6.8 nm. In other variants (not illustrated in a drawing), the exposure radiation 204 can be what is known as DUV radiation, i.e. radiation in the deep UV wavelength range having a wavelength of e.g. 248 nm or 193 nm.

The exposure radiation 204 is incident on a lithography mask 206 with mask structures to be imaged that are arranged thereon. Here, the exposure radiation 204 may be reflected, as shown in FIG. 8, at the lithography mask 206, as is often the case when using EUV radiation. Alternatively, the lithography mask 206 may also be configured as a transmission mask. In this case, the exposure radiation passes through the mask 206.

Imaging the mask structures onto a wafer 214 arranged in an image plane 216 is effected using the projection lens 210, which comprises a multiplicity of mirrors, of which FIG. 8 illustrates by way of example three mirrors, specifically the mirrors 212-1, 212-2 and 212-3. At least one of the mirrors, in the illustrated example the mirror 212-2, has specifications according to one of the above-described exemplary embodiments in accordance with FIG. 7. A mirror heating device 218 is provided for heating the mirror 212-2 to a specified operating temperature of over 32° C. The mirror heating apparatus 218 is configured such that the mirror 212-2 always has, taking into consideration the heat introduced by the exposure radiation 204, the specified operating temperature. To this end, temperature sensors (not illustrated in FIG. 8) and temperature regulation can be provided. The projection lens furthermore has, at an operating temperature of over 32° C. of the at least one mirror 212-2, a system wavefront of less than 0.5 nm RMS auf.

In alternative exemplary embodiments, the specified temperature of the mirror 212-2 is over 35° C. or over 40° C. Additionally, an operating temperature of over 32° C., over 35° C. or over 40° C. can be specified for one of the mirrors 212-1 or 212-3 or in particular for all mirrors of the projection lens 210, and corresponding mirror heating devices can be provided therefor. The projection lens 210 also has a system wavefront of less than 0.5 nm RMS in these embodiments. The projection lens 210 has a system wavefront of less than 0.2 nm RMS in further exemplary embodiments.

The present description of exemplary embodiments is to be understood to be by way of example. The disclosure effected thereby firstly enables the person skilled in the art to understand the present invention and the advantages associated therewith, and secondly encompasses alterations and modifications of the described structures and methods that will be apparent to the person skilled in the art after reviewing the present application. Therefore, all such alterations and modifications, insofar as they fall within the scope of the invention as defined in the accompanying claims, and equivalents thereof, are intended to be covered by the protection of the claims.

| List of reference signs | |
|---|---|
| 10 | Measurement arrangement |
| 12 | Optical surface |
| 14 | Test object |

-continued

List of reference signs

| | |
|---|---|
| 16 | Light source |
| 18 | Input wave |
| 20 | Optical waveguide |
| 22 | Exit surface |
| 24 | Diffractive optical element |
| 26 | Test wave |
| 28 | Reference wave |
| 30 | Reflective optical element |
| 34 | Diffractive structures |
| 36 | Capture device |
| 38 | Beam splitter |
| 40 | Interferometer camera |
| 42 | Propagation axis |
| 44 | Convergent beam |
| 46 | Eyepiece |
| 48 | Capture plane |
| 50 | Vacuum chamber |
| 52 | Heat shield |
| 54 | Positioning drive |
| 56 | Heating apparatus |
| 58 | Propagation direction reference wave |
| 60 | Arrow tilting |
| 62 | Tilted reference wave |
| 64 | Arrow displacement |
| 66 | Plane calibration wave |
| 68 | Spherical calibration wave |
| 70 | Plane calibration mirror |
| 72 | Spherical calibration mirror |
| 74 | Closure apparatus |
| 76 | Shutter |
| 80 | Arrow shift-rotation method |
| 82 | Interferometer |
| 83 | Single-beam/detection module |
| 84 | Fizeau element |
| 86 | Measurement wave |
| 88 | Window |
| 100 | Mirror |
| 102 | Surface |
| 104 | Plane of symmetry desired shape |
| 106 | Desired shape |
| 108 | Best adapted asphere |
| 110 | Rotational axis asphere |
| 200 | Projection exposure apparatus |
| 202 | Illumination system |
| 204 | Exposure radiation |
| 206 | Lithography mask |
| 210 | Projection lens |
| 212 | Mirror |
| 214 | Wafer |
| 216 | Image plane |
| 218 | Mirror heating device |

What is claimed is:

1. A measurement arrangement for interferometrically determining a shape of an optical surface of a test object forming an optical element for microlithography, comprising:
   a light source configured to provide an input wave,
   a diffractive optical element which is arranged in a beam path of the input wave and is configured to produce, from the input wave and by way of diffraction,
      a test wave, which is directed at the test object and which has a wavefront that is adapted at least partially to a desired shape of the optical surface, and
      a reference wave, which has a propagation direction that deviates from a propagation direction of the test wave,
   a reflective optical element which is arranged in the beam path of the reference wave and is configured to back-reflect the reference wave, and
   a capture device configured to capture an interferogram produced by superposition of the test wave after interaction with the test object and the back-reflected reference wave, in each case after a further diffraction at the diffractive optical element, in a capture plane, wherein the diffraction and the further diffraction at the diffractive optical element are first-order or higher-order diffractions.

2. The measurement arrangement as claimed in claim 1, which is configured such that, upon the further diffraction, the test wave is diffracted at the diffractive optical element with a same order of diffraction as the input wave upon the diffraction at the diffractive optical element that takes place to produce the test wave.

3. The measurement arrangement as claimed in claim 1, which is configured such that, upon the further diffraction, the reference wave is diffracted at the diffractive optical element with a same order of diffraction as the input wave upon the diffraction at the diffractive optical element that takes place to produce the input wave.

4. The measurement arrangement as claimed in claim 1, which is configured such that the propagation direction of the reference wave, which is produced by diffraction at the diffractive optical element from the input wave, is tilted with respect to the propagation direction of the input wave by more than 1°.

5. The measurement arrangement as claimed in claim 1, wherein, upon the further diffraction at the diffractive optical element, a return wave is produced by superposition of the test wave after interaction with the test object and the back-reflected reference wave, and wherein the measurement arrangement is configured such that the propagation direction of the return wave is tilted with respect to the reverse propagation direction of the input wave by less than 1°.

6. The measurement arrangement as claimed in claim 1, which is configured such that the wavefront of the test wave after the further diffraction at the diffractive optical element deviates from a spherical wavefront that is best adapted to the wavefront of the input wave by at most 10 μm.

7. The measurement arrangement as claimed in claim 1, wherein the diffractive optical element has two diffractive structural patterns that are arranged such that they superimpose each other in a plane, and wherein one of the diffractive structural patterns is configured to produce the test wave and the other diffractive structural pattern is configured to produce the reference wave.

8. The measurement arrangement as claimed in claim 7, wherein the diffractive structural pattern producing the reference wave is further configured to adapt the wavefront of the reference wave to the shape of the reflective optical element such that the reference wave is reflected back to the diffractive element.

9. The measurement arrangement as claimed in claim 1, wherein the reflective optical element is mounted to tilt with respect to an axis that is arranged perpendicular to the propagation direction of the reference wave.

10. The measurement arrangement as claimed in claim 1, wherein the reflective optical element is mounted to displace along a propagation direction of the reference wave.

11. A method for interferometrically determining a shape of a surface of a test object forming an optical element for microlithography, comprising:
   providing an input wave,
   producing a test wave, which is directed at the test object and which has a wavefront that is adapted at least partially to a desired shape of the optical surface, and a reference wave, which is directed at a reflective optical element and has a propagation direction that deviates from a propagation direction of the test wave, from the input wave in each case by diffraction at a diffractive optical element, superposing the test wave after interaction with the test object with the reference wave after back-reflection at the reflective optical element, wherein the test wave and the reference wave are diffracted again in each case by further diffraction at the diffractive optical element, and capturing an interferogram produced by the superposition of the test wave and the reference wave in a capture plane, wherein the diffraction and the further diffraction at the diffractive optical element are first-order or higher-order diffractions.

12. The method as claimed in claim 11, comprising:

producing at least one calibration wave, which is directed at a calibration mirror and has a plane or spherical wavefront, from the input wave with the diffractive optical element, determining surface defects of the reflective optical element and the at least one calibration mirror, measuring a wavefront difference between the reflective optical element and the calibration mirror, determining calibration corrections from the measured wavefront difference and the surface defects, and determining the shape of the surface of the test object from the captured interferogram and the calibration corrections.

13. A measurement arrangement for interferometrically determining a shape of an optical surface of a test object forming an optical element for microlithography, comprising:

a light source configured to provide an input wave, a diffractive optical element which is arranged in a beam path of the input wave and is configured to produce, from the input wave and by way of diffraction, a test wave, which is directed at the test object and which has a wavefront that is adapted at least partially to a desired shape of the optical surface, and a reference wave, which has a propagation direction that deviates from a propagation direction of the test wave, a reflective optical element which is arranged in the beam path of the reference wave and is configured to back-reflect the reference wave, and a capture device configured to capture an interferogram produced by superposition of the test wave after interaction with the test object and the back-reflected reference wave, in each case after a further diffraction at the diffractive optical element, in a capture plane, wherein the diffractive optical element has two diffractive structural patterns that are arranged such that they superimpose each other in a plane, and wherein one of the diffractive structural patterns is configured to produce the test wave and the other diffractive structural pattern is configured to produce the reference wave.

* * * * *

UNITED STATES PATENT AND TRADEMARK OFFICE
CERTIFICATE OF CORRECTION

PATENT NO. : 10,337,850 B2
APPLICATION NO. : 15/821050
DATED : July 2, 2019
INVENTOR(S) : Jochen Hetzler et al.

Page 1 of 1

It is certified that error appears in the above-identified patent and that said Letters Patent is hereby corrected as shown below:

On the Title Page

Page 2, Column 2, Line 9, Delete "hologrmas." and insert -- holograms. --, therefor.

Signed and Sealed this
First Day of September, 2020

Andrei Iancu
*Director of the United States Patent and Trademark Office*